US012696607B2

(12) United States Patent
Hansen

(10) Patent No.: US 12,696,607 B2
(45) Date of Patent: Jul. 28, 2026

(54) EMISSIVE LED DISPLAY WITH HIGH AND LOW BLUE MODES

(71) Applicant: KORRUS, INC., Los Angeles, CA (US)

(72) Inventor: Monica Hansen, Los Angeles, CA (US)

(73) Assignee: KORRUS, INC., Anaheim, CA (US)

( * ) Notice: Subject to any disclaimer, the term of this patent is extended or adjusted under 35 U.S.C. 154(b) by 365 days.

(21) Appl. No.: 18/235,538

(22) Filed: Aug. 18, 2023

(65) Prior Publication Data

US 2024/0063333 A1 Feb. 22, 2024

Related U.S. Application Data

(60) Provisional application No. 63/399,034, filed on Aug. 18, 2022.

(51) Int. Cl.
| | |
|---|---|
| *H10H 29/30* | (2025.01) |
| *H10H 20/00* | (2025.01) |
| *H10H 20/812* | (2025.01) |
| *H10H 20/813* | (2025.01) |
| *H10H 20/856* | (2025.01) |
| *H10H 29/14* | (2025.01) |
| *H10W 90/00* | (2026.01) |

(52) U.S. Cl.
CPC ............ *H10H 29/30* (2025.01); *H10H 20/00* (2025.01); *H10H 20/812* (2025.01); *H10H 20/813* (2025.01); *H10H 20/856* (2025.01); *H10H 29/14* (2025.01); *H10W 90/00* (2026.01)

(58) Field of Classification Search
None
See application file for complete search history.

(56) References Cited

U.S. PATENT DOCUMENTS

| | | | | |
|---|---|---|---|---|
| 2009/0078955 A1* | 3/2009 | Fan | ......................... | H10H 29/10 |
| | | | | 438/46 |
| 2018/0040665 A1* | 2/2018 | Ohmae | .................. | H10D 64/20 |
| 2020/0350477 A1* | 11/2020 | Shim | .................. | H10H 20/8312 |
| 2021/0184076 A1* | 6/2021 | Kim | ..................... | H10H 20/811 |
| 2022/0190198 A1* | 6/2022 | Wildeson | ............. | H10H 20/841 |
| 2023/0307579 A1* | 9/2023 | Li | ......................... | H10H 29/142 |

* cited by examiner

*Primary Examiner* — Feifei Yeung Lopez
(74) *Attorney, Agent, or Firm* — FisherBroyles LLP

(57) ABSTRACT

A display comprising: (a) a plurality of pixels, each of said plurality of pixels comprising three sub pixels with each subpixel comprising an LED, wherein at least one LED of said three subpixels of each pixel comprises a dual wavelength LED; and (b) at least one driver for driving LEDs of said three subpixels, said at least one driver having three contacts for said at least one LED of each pixel.

14 Claims, 14 Drawing Sheets n-contact #3

Tunnel
Junction n++ GaN
p++ GaN passivation n-GaN

InGaN/GaN MQW #2 n-contact #2 n-GaN

Tunnel
Junction n++ GaN
p++ GaN n-GaN

InGaN/GaN MQW #1

InGaN SL n-contact #1 n-GaN u-GaN

Substrate

Sapphire n-GaN

InGaN MQW
p-GaN n-contact

DBR n-pad

Transparent
conductive oxide p-pad

EMISSIVE LED DISPLAY WITH HIGH AND LOW BLUE MODES

REFERENCE TO RELATED APPLICATION

This application is based on U.S. Provisional Application No. 63/399,034, filed Aug. 18, 2022, hereby incorporated by reference in its entirety.

FIELD OF INVENTION

The subject matter herein relates generally to emissive displays, and, more particularly, to an emissive display having high and low blue modes.

BACKGROUND

As opposed to backlit displays, an emissive display tends to have much higher efficiencies by eliminating the optical losses in polarizers and color filters present in liquid crystal displays (LCD). There are two primary solid-state lighting (SSL) approaches for producing emissive displays today—OLEDs and mini/micro-LEDs. Each technology has R&D challenges to improve performances and implement in mass production, but also provides pathways to significantly decrease display power consumption. Mini- and micro-LEDs also provide the ability to achieve more precise spectral tuning for improving color rendering or human physiological impacts from light (circadian effects). Benefits of micro-LEDs in displays also include fast refresh rates, high pixel density, wide color gamut and high dynamic range (with near-infinite contrast ratios because black pixels are entirely off).

LEDs are placed in each pixel such that the intensity and color is controlled at the source, rather than by modulated absorption. Display systems often combine red, green, and blue (RGB) illuminants to create the gamut of colors achieved by the display. A typical blue wavelength in RGB displays is 465 nm, which can lead to circadian-inducing effects (melatonin suppression peaks at 480 nm). Implementing a shorter wavelength blue source (420 nm or less) can reduce the melatonin suppression and reduce circadian disruption. To create two operational modes (one with lower blue wavelength channel and one with a higher blue wavelength channel), a fourth LED chip is added to the display. Adding a second operational mode with a lower blue wavelength LED (420 nm or less) to reduce melatonin suppression makes the system design more complex.

Three-color channel RGB dominates the displays landscape, so adding a fourth LED chip for the additional lower blue wavelength, requires a 33% increase in the LED chip supply, and a 33% increase in chip transfers to display panel backplane. Considering the LED chip cost itself and the cost of chip transfer dominates the overall manufacturing costs of mini- or micro-LED displays, adding a fourth LED chip becomes cost prohibitive.

Therefore, Applicant recognizes the need for an emissive display having high and low blue light operational modes that avoids the complexity of a fourth subpixel. The present application fulfills this need among others.

SUMMARY OF INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

Applicant recognizes that incorporating a dual wavelength blue LED chip into an emissive display can provide high and low blue light operational modes, while fitting within the conventional RGB display architecture.

Accordingly, in one embodiment, the present invention relates to a display comprising: (a) a plurality of pixels, each of said plurality of pixels comprising three sub pixels with each subpixel comprising an LED, wherein at least one LED of said three subpixels of each pixel comprises a dual wavelength LED; and (b) at least one driver for driving LEDs of said three subpixels, said at least one driver having three contacts for said at least one LED of each pixel.

In another embodiment, invention relates to the dual wavelength LED used in an emissive display as described above.

DETAILED DESCRIPTION

A dual wavelength blue LED may be produced in different chip configurations. Generally, although not necessarily, the dual wavelength LED chip comprises multiple active regions to emit the two different wavelengths. In one embodiment, the dual wavelength LED is a blue LED configured to selectively emit the two different wavelengths, a first wavelength having a first peak wavelength above 440 nm, and a second wavelength having a second peak wavelength below 440 nm. In one embodiment, the first peak wavelength is no less than 460 nm, and the second peak wavelength is no greater than 420 nm. There are different device configurations to create dual wavelength LEDs. For example, architectures of particular interest herein to create dual wavelength LEDs include cascaded multi-junction LEDs and side-by-side multi-junction LEDs. It should be understood that this technology applies to micro-LEDs (<50 microns), mini-LEDs (>50 and <200 microns) or conventional size LEDs (~300 microns to 2 mm).

Figure 1:
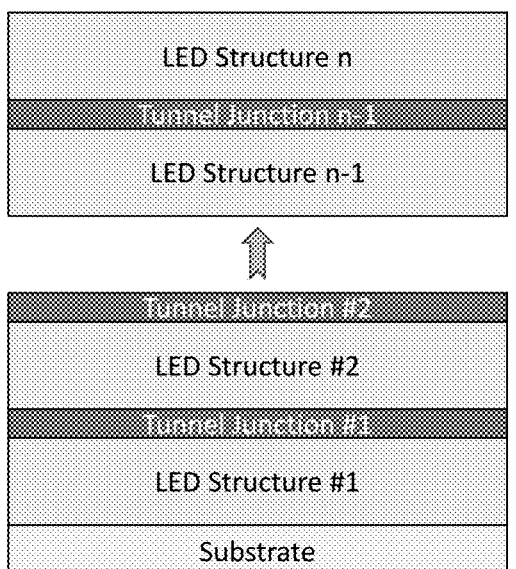
FIG. 1 shows a schematic of one embodiment of a cascaded multi junction LED of the present invention.

Referring to FIG. 1, a schematic of a cascaded multi junction LED is shown. A cascaded multi junction LEDs has multiple stacked LED heterostructures separated by a tunnel junction to allow current to keep flowing through the vertical stack. As is known, the tunnel junction is created by a heavily doped p-n junction, which forms a thin depletion region that allows for carrier tunneling across the junction under sufficient reverse bias. When the LED device (i.e., n-p-n structure) is forward biased, a reverse bias occurs across the tunnel junction allowing electrons to tunnel, thus injecting holes into the active region of the device. In one embodiment, the tunnel junction comprises an InGaN layer between the p++ and n++ to further improve the tunneling probability (reducing the overall tunnel junction on-resistance).

Figure 2:
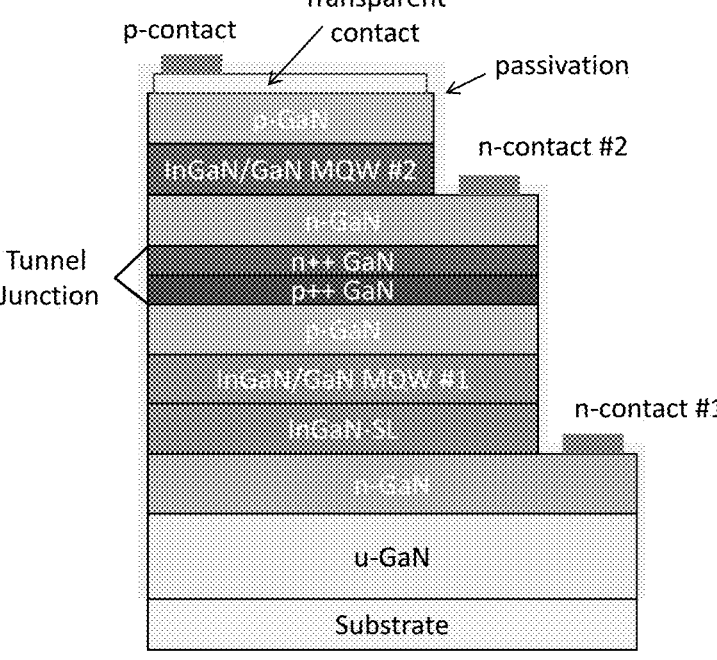
FIG. 2 shows one embodiment of a three-contact chip architecture.

The junctions are driven together through one anode and cathode or individually addressed. However, to create addressable dual wavelength LED chip, the two LED junctions should be driven separately—leading to a three-contact chip architecture as shown in FIG. 2.

Figure 3:
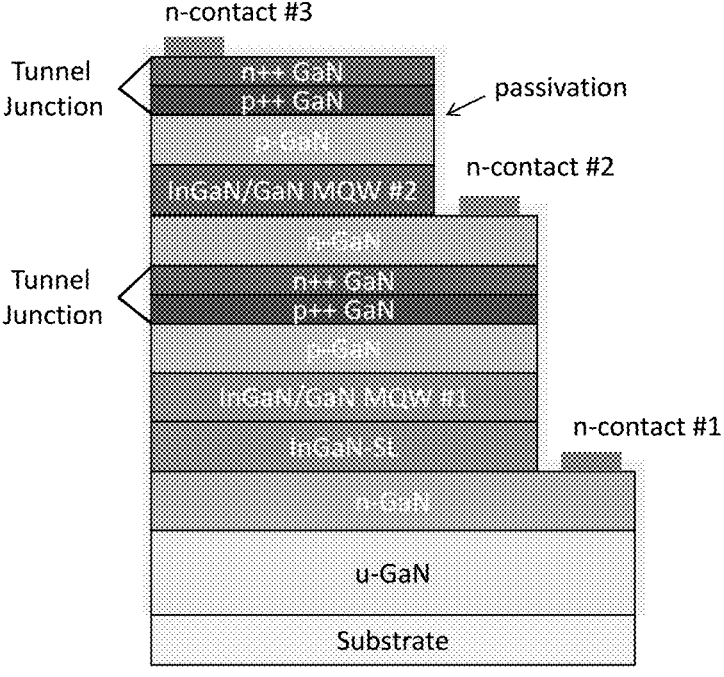
FIG. 3 shows one embodiment of an LED terminated with a tunnel junction to create a top side n-contact instead of a p-contact.

As shown in FIG. 3, in one embodiment, the LED can terminate with a tunnel junction to create a top side n-contact instead of a p-contact. Such a configuration may be preferred because an n-type GaN semiconductor layers are less resistive than p-GaN and n-contacts have a lower series resistance than p-contacts. Regardless, the resistance of the tunnel junction should be less than the increased spreading resistance in the semiconductor layer plus the contact resistance.

Figure 4:
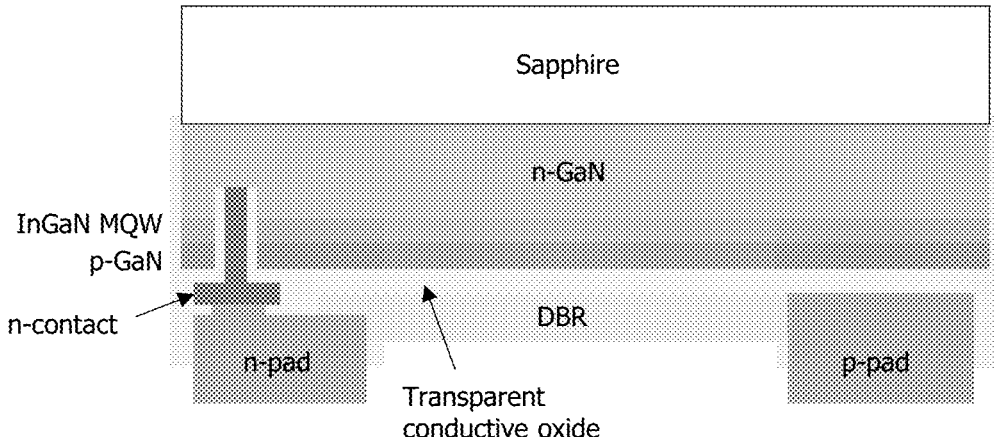
FIG. 4 shows a typical flip chip LED configuration for displays (e.g. mini-LEDs).
Figure 5A:
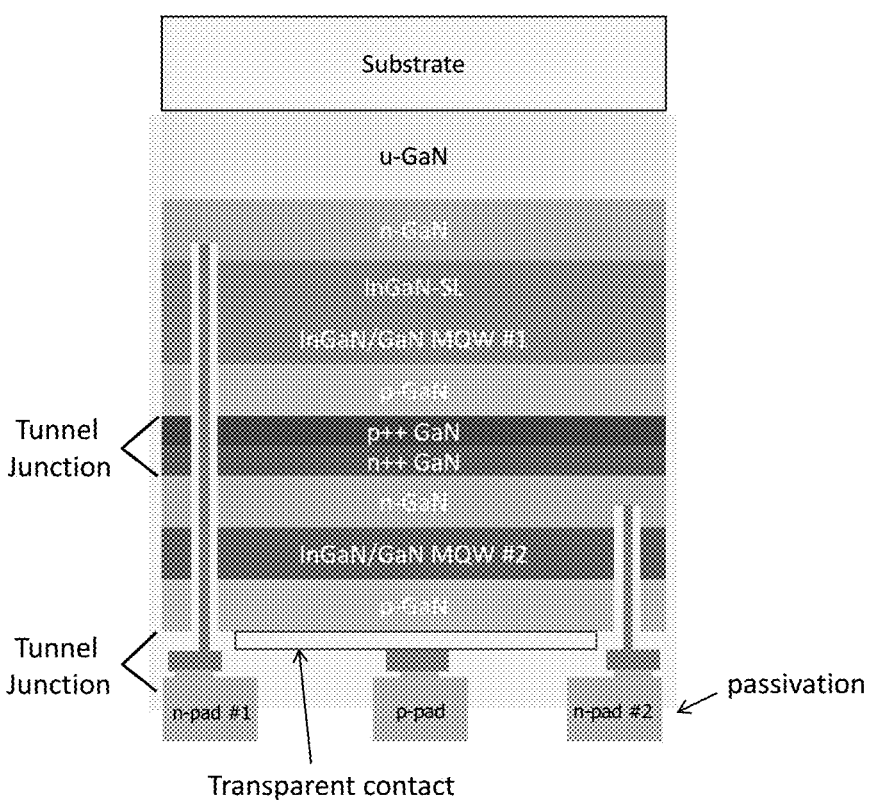
FIGS. 5A-5H show selected embodiments of an individually-addressable dual wavelength stacked LED structure (using tunnel junctions) having a flip chip configuration.
Figure 5B:
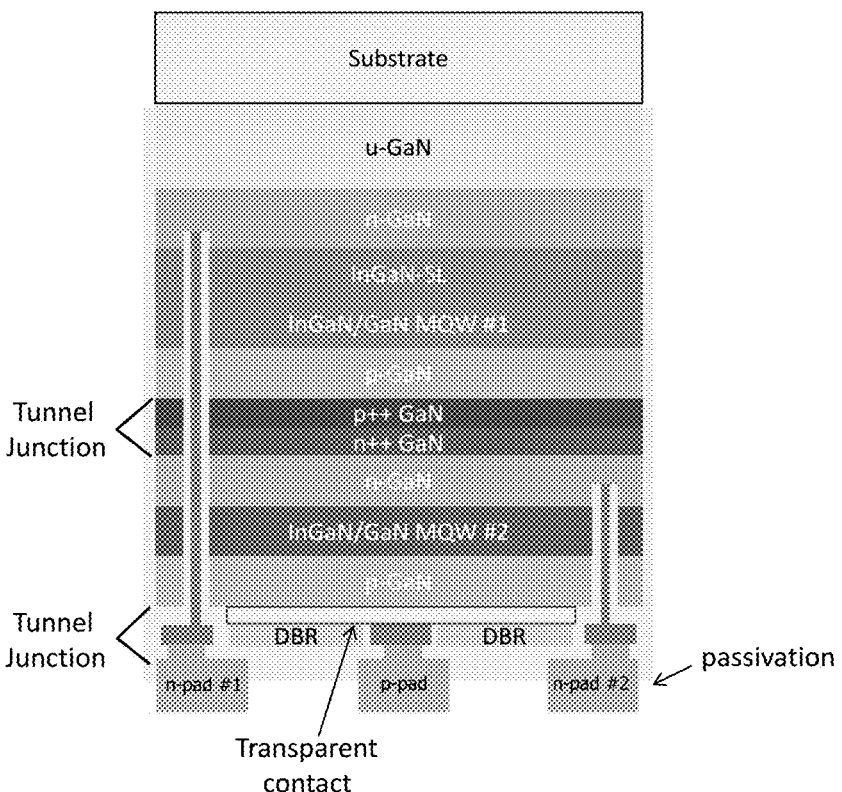
Figure 5C:
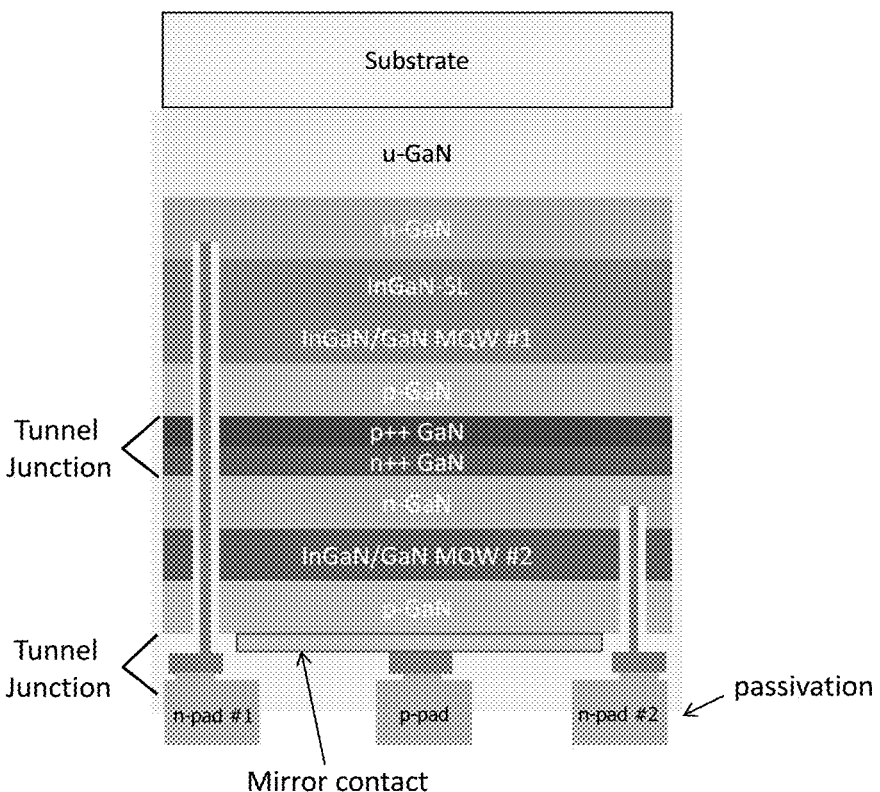
Figure 5D:
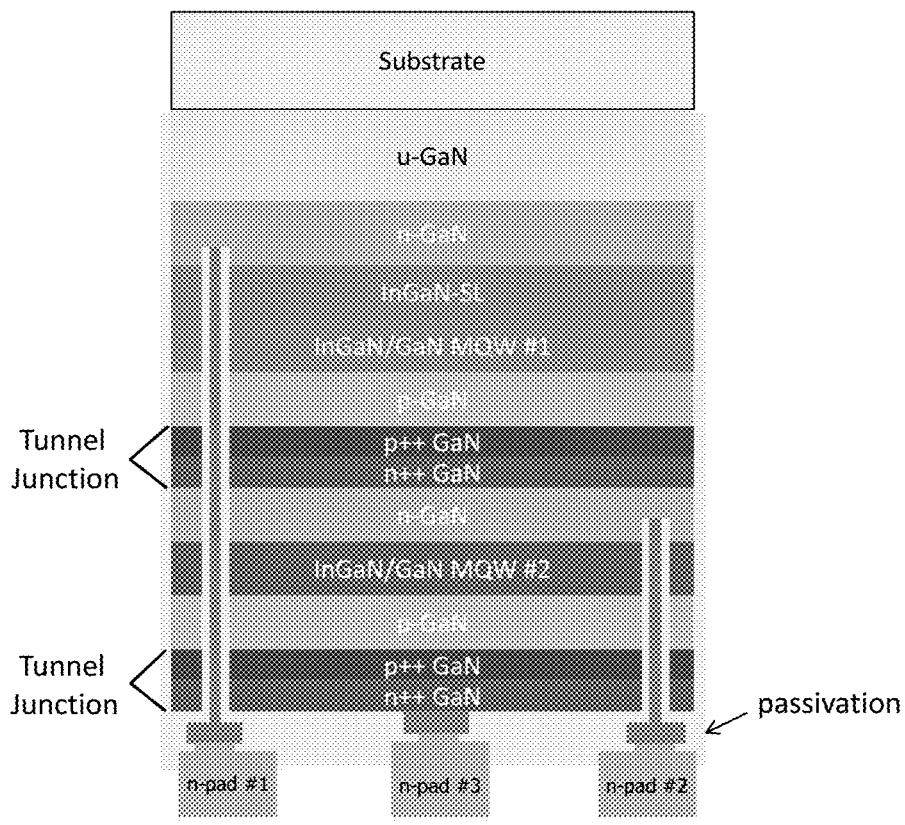
Figure 5E:
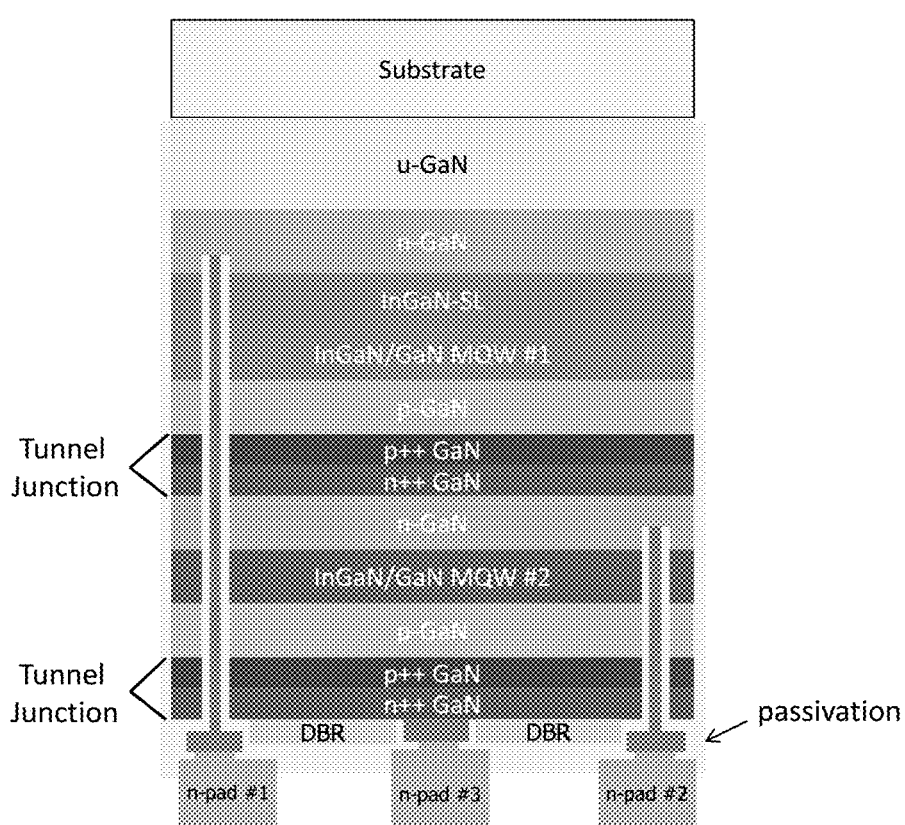
Figure 5F:
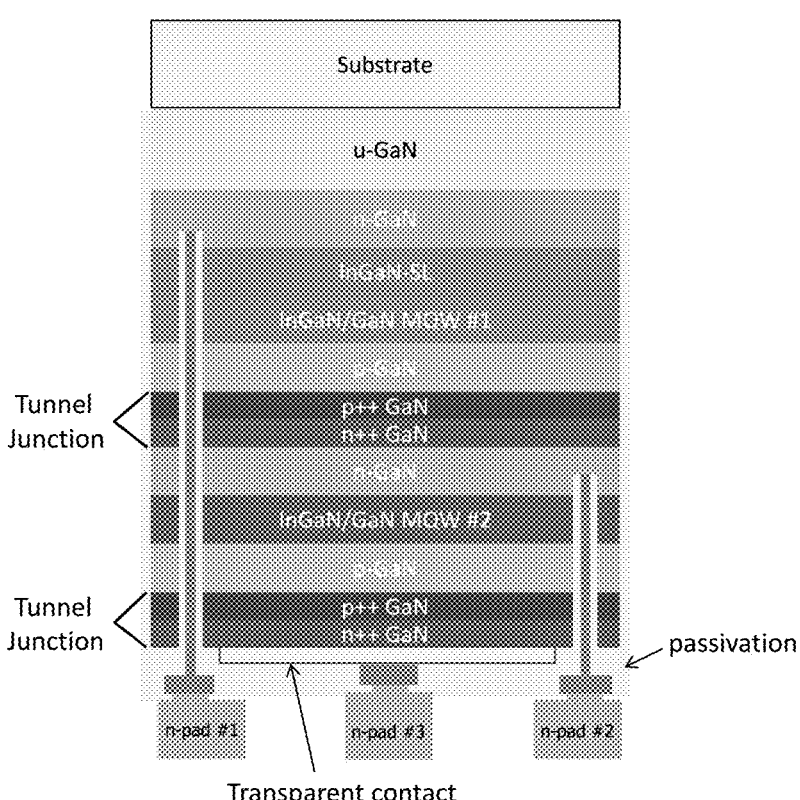
Figure 5G:
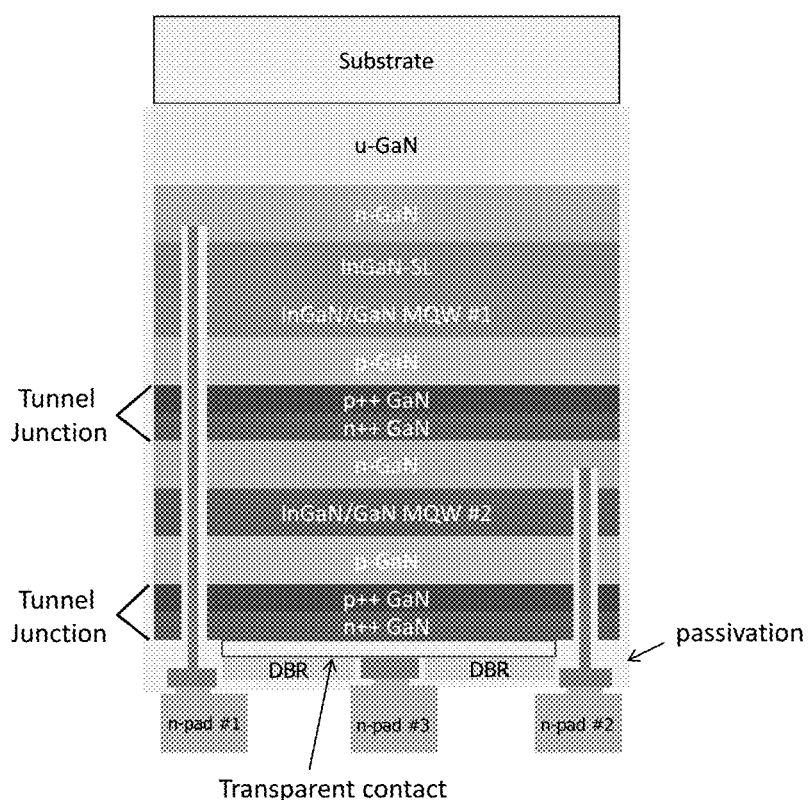
Figure 5H:
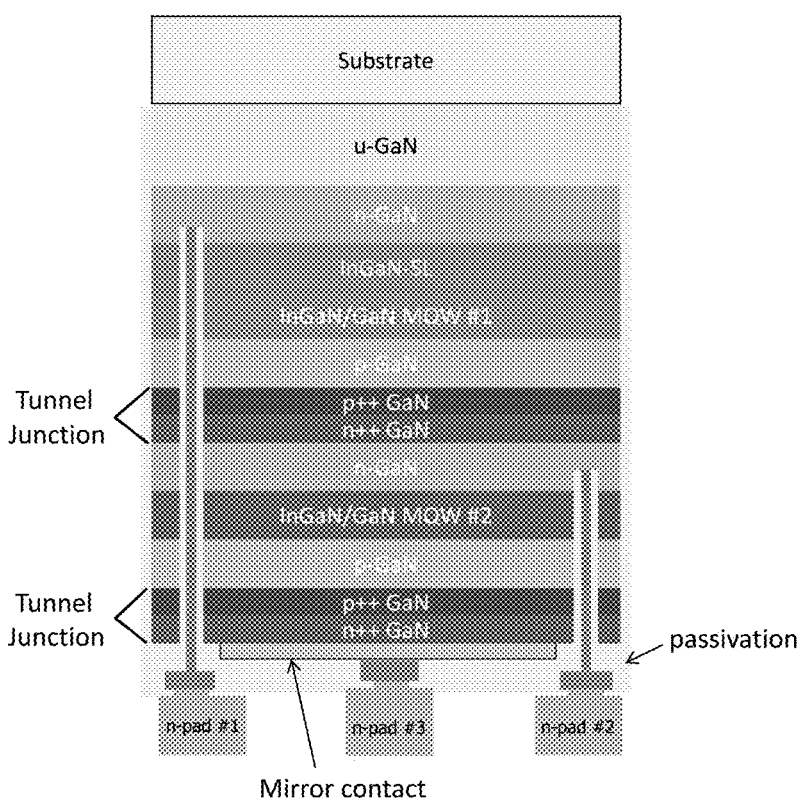

For micro-LED or mini-LED display backplanes, the flip chip configuration is preferred over wire-bonded chips. A typical flip chip LED configuration for displays (e.g. mini-LEDs) is shown in FIG. 4.

Referring to FIGS. 5A-5H, selected embodiments of an individually-addressable dual wavelength stacked LED structure (using tunnel junctions) having a flip chip configuration are shown. In one embodiment, a distributed Bragg reflector (DBR) or metal mirror contact is added to reflect more light upward out of the substrate. The chip can also have a final tunnel junction layer on the top p-GaN layer to allow for a final n-contact (lower contact resistance) than a p-contact as discussed above.

A dual wavelength chip can also be created with two spatially separated p-n junctions side-by-side on the same monolithic chip. In one embodiment, this is achieved by growing the first LED heterostructure on a substrate followed by the growth of a second LED heterostructure with a different wavelength active region on half of the monolithic chip. Creating two individual addressable portions (or halves) of the monolithic chip allows dual wavelength functionality in the footprint of a single LED chip. Although this necessarily means that the chip for any given wavelength is essentially half of the footprint, such a reduction in effective size of the LED tends to be insignificant. More specifically, the number of blue photons required in a RGB display is much lower than the number of red or green photons, therefore a dual wavelength monolithic chip configuration with side-by-side junctions can produce sufficient optical radiation even with half the chip area dedicated to each of the two blue wavelengths. Thus, such a configuration is a viable option to replace a single blue chip with a dual junction LED chip.

Side-by-side dual wavelength LED junctions may be achieved in multiple ways. Two such approaches are described with the chip structures shown in FIGS. 6A-6B and 7A-7B. Both involve the growth of the first LED heterostructure, followed by a regrowth of the second LED structure with a different wavelength.

Figure 6A:
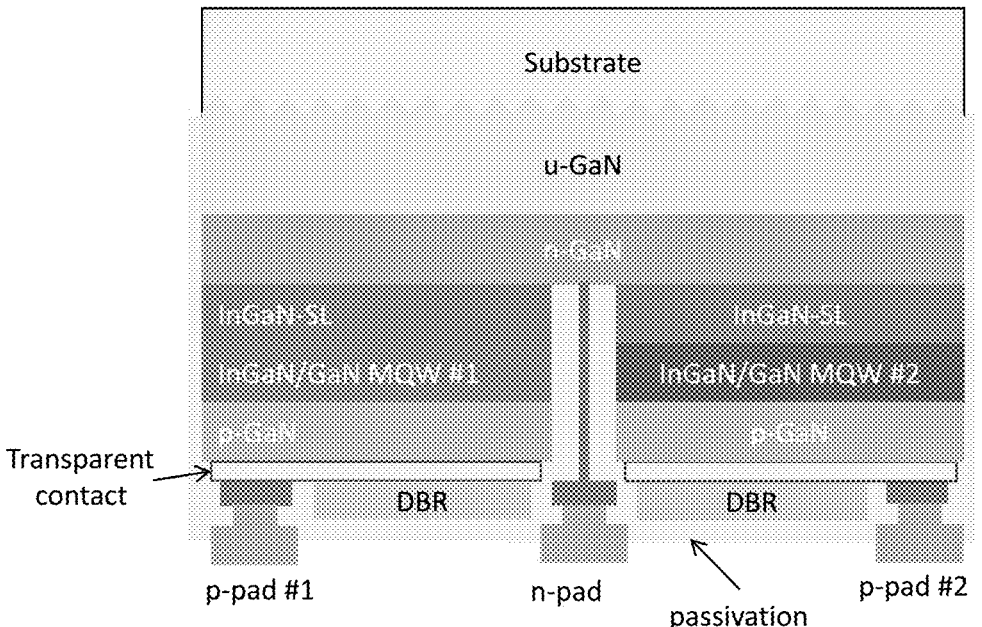
FIGS. 6A-6B show one approach for achieving side-by-side dual wavelength LED junctions.
Figure 6B:
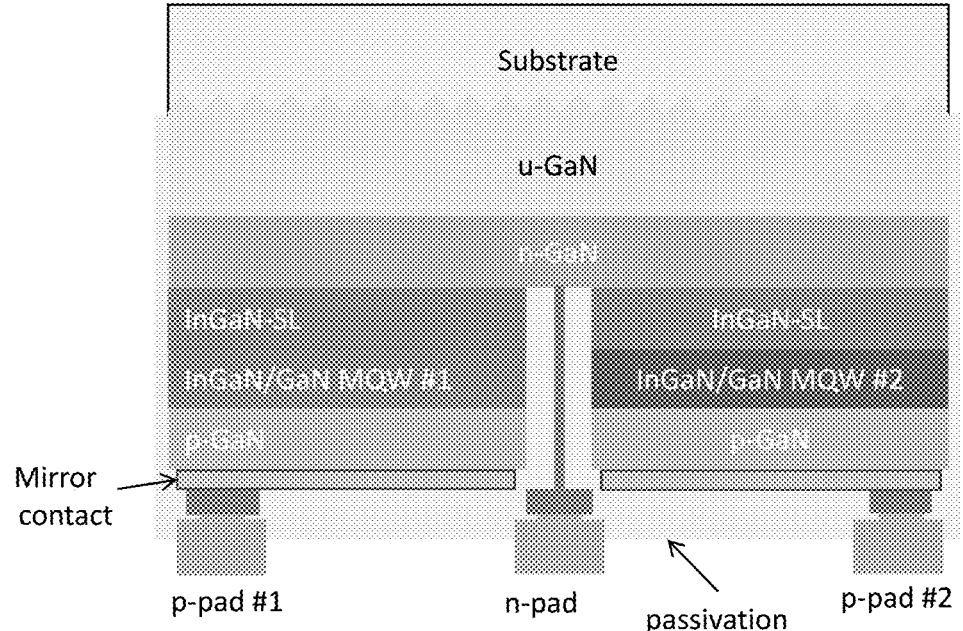

Referring to FIGS. 6A and 6B, in the first approach, the first LED heterostructure is etched to the n-GaN layer on a portion of the chip to regrow the second heterostructure on the side of the first heterostructure, while maintaining a monolithic chip structure. In one embodiment, to etch part of the first LED heterostructure without damaging the portion this first LED heterostructure that will remain intact, an etch mask (e.g. $SiO_2$ or SiN) is applied to the top of the first heterostructure to protect portion of the LED structure that is not being etched away. The etch mask then is removed from the second portion of the monolithic chip that is to be etched away. In one embodiment, a dry etch process is used to etch the first LED heterostructure to the n-GaN surface. In accordance with this embodiment, the LED precursor is then returned to the growth reactor to complete a regrowth of the second LED heterostructure, starting with an n-GaN layer regrowth followed by the rest of the LED heterostructure with the second desired wavelength for the active region. This structure is a flip chip as shown in FIG. 6A or a standard lateral chip configuration. In one embodiment, the transparent contact and DBR mirror can be replaced with a metal mirror contact as shown in FIG. 6B.

Figure 7A:
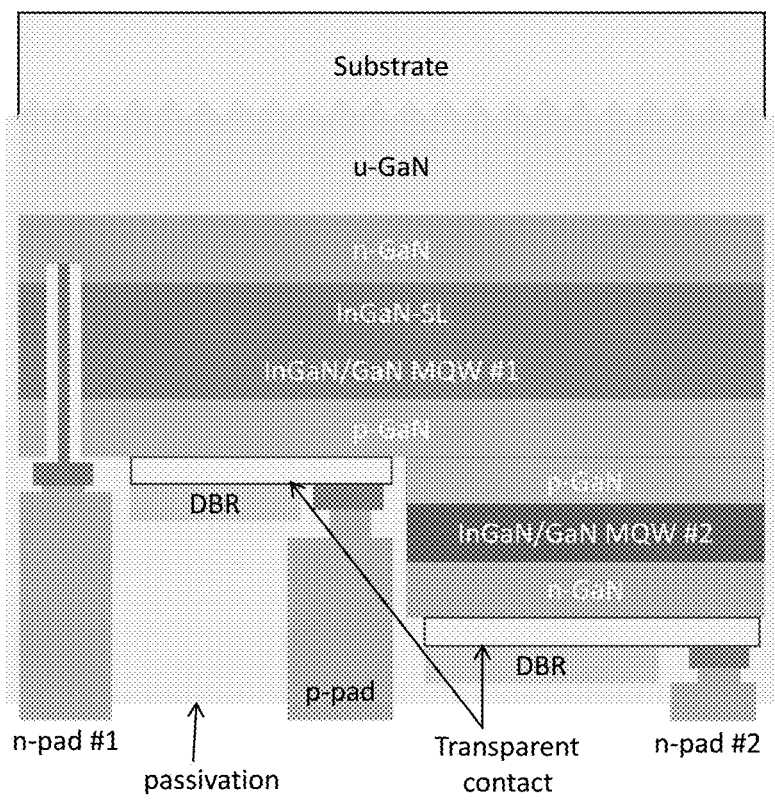
FIGS. 7A-7B show another approach for achieving side-by-side dual wavelength LED junctions.
Figure 7B:
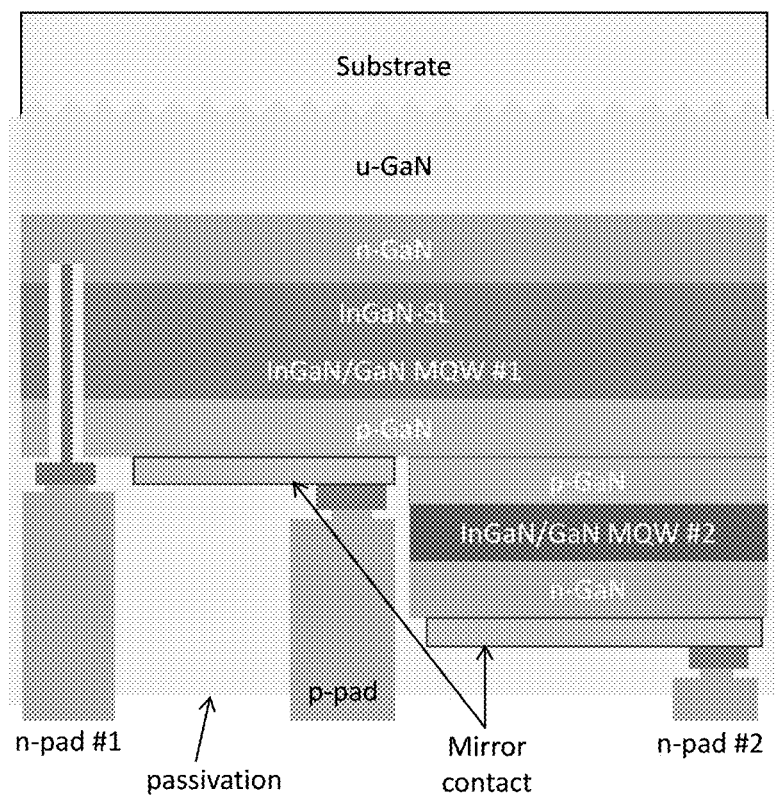

Referring to FIGS. 7A and 7B, embodiments of a second configuration for a dual wavelength chip with two separate p-n junctions side by side on the same monolithic chip using a common p-contact are shown. This approach involves the growth of the first LED heterostructure, followed by a regrowth of a portion of the chip with the second LED structure with a different wavelength. In one embodiment, an etch mask is applied to the top of the first heterostructure to cover and protect the portion of the LED structure that will not have additional layers grown. The etch mask is then removed from the second portion of the monolithic chip, which is regrown with the second LED heterostructure. The LED precursor is then returned to the growth reactor to complete a regrowth of the second LED heterostructure, starting with an p-GaN layer regrowth followed by the active region and terminated with the n-GaN layer for the second LED heterostructure with the second desired wavelength for the active region. This structure is a flip chip as shown below or a standard lateral chip configuration.

Figure 8A:
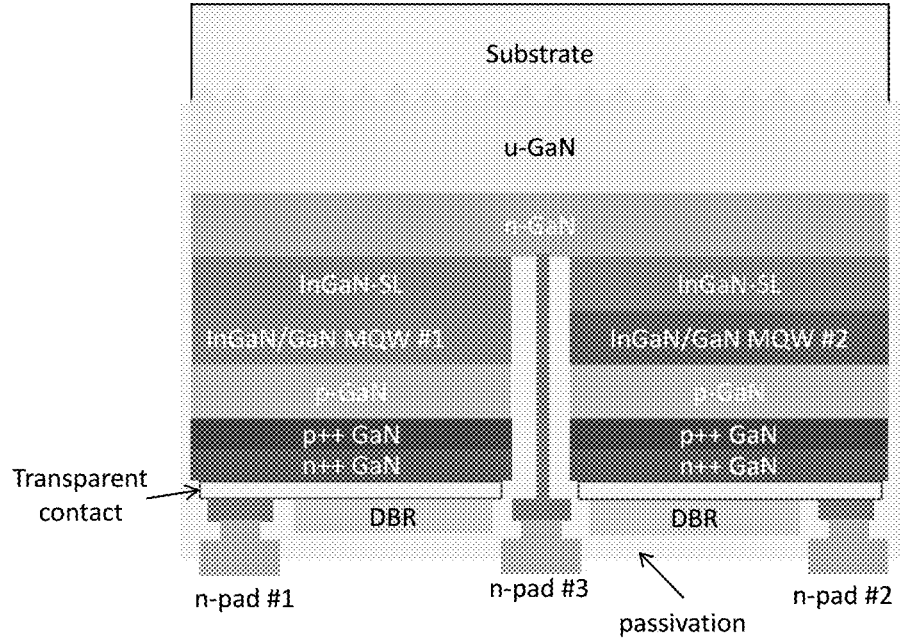
FIGS. 8A and 8B show tunnel junctions implemented in side-by-side p-n junction chip configurations.
Figure 8B:
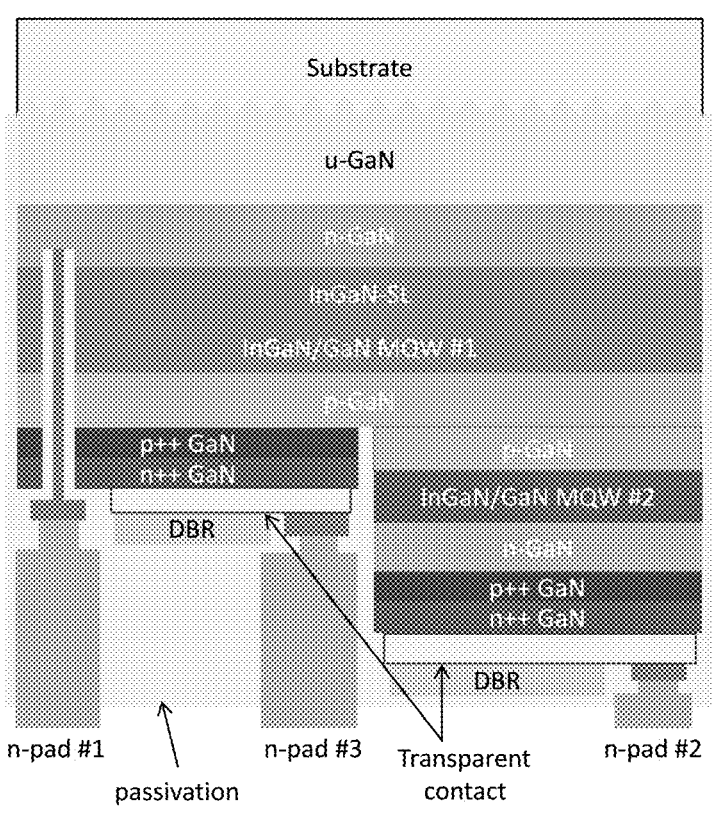

In one embodiment, tunnel junctions can also be implemented in these side-by-side p-n junction chip configurations as shown in FIGS. 8A and 8B.

Integrating a dual wavelength chip and a conventional display has advantages over integrating two distinct chips. Specifically, creating a dual wavelength vertical chip structure is easier to integrate into many display and lighting architectures since it can replace existing single wavelength chips by fitting into the same chip footprint while maintaining an equivalent light emitting area. However, it should be understood that an individually-addressable dual wavelength chip will require a third circuit trace to allow the system to drive each of the two different wavelength active regions independently.

Compared to cascading LEDs, a side-by-side dual wavelength architecture can have more benefits in spectral tuning capabilities and spatial mixing of light since the two light emitting regions are spatially separated. This can allow for more flexibility to create a greater variety of spectral power distributions, which is advantageous especially for lighting applications in a variety of lighting form factors and architectures (including thin backlight architectures). Additionally, both junctions of the dual wavelength chip is run simultaneously to provide both wavelengths of light without as much self-heating. In some chip configurations, this side-by-side architecture can lead to more balanced carrier injection between the two junctions (see, e.g., FIGS. 6A, 6B, and 8A.)

These and other advantages maybe realized in accordance with the specific embodiments described as well as other variations. It is to be understood that the above description is intended to be illustrative, and not restrictive. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled.

What is claimed is:

1. A display comprising:
   a plurality of pixels, each of said plurality of pixels comprising three sub pixels with each subpixel comprising an LED, wherein at least one LED of said three subpixels of each pixel comprises a dual wavelength LED, said dual wavelength LED being a blue LED configured to selectively emit the two different wavelengths, a first wavelength having a first peak wavelength above 440 nm, and a second wavelength having a second peak wavelength below 440 nm; and
   at least one driver for driving LEDs of said three subpixels, said at least one driver having three contacts for said at least one LED of each pixel.

2. The display of claim 1, wherein said at least one LED is a flip chip LED.

3. The display of claim 2, wherein said at least one LED is a cascading multi-junction LED or side-by-side multi-junction LED.

4. The display of claim 3, wherein each junction of said cascading multi-junction LED and side-by-side multi-junction LED is independently controllable.

5. The display of claim 3, wherein said cascading multi-junction LED and side-by-side multi-junction LED are dual junction LEDs.

6. The display of claim 5, wherein said dual junctions of said at least one LEDs are driven separately.

7. The display of claim 3, wherein said at least one LED is a cascading multi-junction LED.

8. The display of claim 7, wherein said at least one LED comprises multiple stacked LED heterostructure separated by at least one tunnel junction to allow current to keep flowing through the vertical stack.

9. The display of claim 8, wherein said tunnel junction comprises an InGaN layer to further improve tunneling.

10. The display of claim 7, wherein said at least one LED is terminated with a second tunnel junction to create a top side n-contact instead of a p-contact.

11. The display of claim 7, wherein said at least one LED comprises a distributed Bragg reflector (DBR) or metal mirror contact added to reflect more light upward out of a substrate.

12. The display of claim 3, wherein said at least one LED is a side-by-side multi-junction LED.

13. The display of claim 12, wherein said at least one LED comprises at least one tunnel junction.

14. The display of claim 1, wherein said first peak wavelength no less than 460 nm, and said second peak wavelength is no greater than 420 nm.

* * * * *